United States Patent
Longsdorf et al.

(10) Patent No.: US 7,280,048 B2
(45) Date of Patent: Oct. 9, 2007

(54) PROCESS CONTROL LOOP CURRENT VERIFICATION

(75) Inventors: Randy J. Longsdorf, Chaska, MN (US); Garrie D. Huisenga, Chaska, MN (US); James A. Johnson, Savage, MN (US)

(73) Assignee: Rosemount Inc., Eden Prairie, MN (US)

( * ) Notice: Subject to any disclaimer, the term of this patent is extended or adjusted under 35 U.S.C. 154(b) by 37 days.

(21) Appl. No.: 11/095,386

(22) Filed: Mar. 31, 2005

(65) Prior Publication Data

US 2005/0168343 A1    Aug. 4, 2005

Related U.S. Application Data

(63) Continuation-in-part of application No. 10/733,558, filed on Dec. 11, 2003, which is a continuation-in-part of application No. 10/635,944, filed on Aug. 7, 2003, now Pat. No. 7,018,800.

(51) Int. Cl.
G08B 21/00    (2006.01)

(52) U.S. Cl. .................. 340/664; 340/635; 700/79; 700/80

(58) Field of Classification Search ................ 340/635
See application file for complete search history.

(56) References Cited

U.S. PATENT DOCUMENTS

| | | | |
|---|---|---|---|
| 4,804,958 A * | 2/1989 | Longsdorf | 340/870.07 |
| 5,036,886 A | 8/1991 | Olsen et al. | 137/625.65 |
| 5,416,409 A | 5/1995 | Hunter | 324/158.1 |
| 5,481,200 A * | 1/1996 | Voegele et al. | 324/718 |
| 5,573,032 A | 11/1996 | Lenz et al. | 137/486 |
| 5,682,476 A | 10/1997 | Tapperson et al. | 395/200.05 |
| 5,956,663 A * | 9/1999 | Eryurek | 702/183 |
| 5,970,430 A | 10/1999 | Burns et al. | 702/122 |
| 6,014,612 A * | 1/2000 | Larson et al. | 702/183 |
| 6,026,352 A | 2/2000 | Burns et al. | 702/182 |
| 6,176,247 B1 | 1/2001 | Winchcomb et al. | 137/14 |
| 6,186,167 B1 | 2/2001 | Grumstrup et al. | 137/487.5 |
| 6,445,963 B1 * | 9/2002 | Blevins et al. | 700/44 |

(Continued)

FOREIGN PATENT DOCUMENTS

DE    42 09 785 A1    9/1993

(Continued)

OTHER PUBLICATIONS

U.S. Appl. No. 10/635,944, filed Aug. 7, 2003.

(Continued)

*Primary Examiner*—Daniel Wu
*Assistant Examiner*—Eric M. Blount
(74) *Attorney, Agent, or Firm*—Westman, Champlin & Kelly, P.A.

(57) ABSTRACT

A process device is configured for coupling to a two wire process control loop. Loop current output circuitry is configured to apply an output current to the two wire process control loop. Loop current verification circuitry is coupled to the two wire process control loop and configured to detect errors in the applied output current. At least a portion of the loop current verification circuitry is independent from the loop current output circuitry.

23 Claims, 15 Drawing Sheets

U.S. PATENT DOCUMENTS

| | | | |
|---|---|---|---|
| 6,512,358 B2* | 1/2003 | Klofer et al. | 340/870.39 |
| 6,631,882 B2 | 10/2003 | Mack | 251/129.04 |
| 7,089,086 B2 | 8/2006 | Schoonover | 700/275 |
| 2002/0082799 A1 | 6/2002 | Pramanik | 702/130 |
| 2002/0121910 A1 | 9/2002 | Rome et al. | 324/718 |
| 2003/0062494 A1 | 4/2003 | Snowbarger et al. | 251/89 |
| 2005/0149295 A1* | 7/2005 | Pfundlin et al. | 702/189 |

FOREIGN PATENT DOCUMENTS

| | | |
|---|---|---|
| DE | 298 24 256 U1 | 7/2001 |
| EP | 1 396 771 A1 | 3/2004 |
| WO | WO98/29785 | 7/1998 |
| WO | WO 00/79352 A2 | 12/2000 |
| WO | WO 03/040657 A2 | 5/2003 |
| WO | WO 03/040851 A2 | 5/2003 |
| WO | WO 03/060851 A1 | 7/2003 |

OTHER PUBLICATIONS

U.S. Appl. No. 10/719,163, filed Nov. 21, 2003.
U.S. Appl. No. 10/733,558, filed Dec. 11, 2003.
U.S. Appl. No. 10/829,124, filed Apr. 21, 2004.
U.S. Appl. No. 10/866,930, filed Jun. 14, 2004.
U.S. Appl. No. 10/955,790, filed Sep. 30, 2004.
"Functional Safety and Safety Integrity Levels", *Application Note,* Apr. 2002, pp. 1-6.
Article entitled "Safety Field$^{IT}$2600T Pressure Transmitter Family", *ABB Instrumentation Spa,* 29 pages.
Fieldvue Instruments, article entitled "Improving Safety Instrumented System Reliability", *Emerson Process Management,* Feb. 2002, 8 pages.
Search Report "Notification of Transmittal of The International Search Report of the Declaration", PCT/US2004/025289.
"Safety Networks—Increase Productivity, Reduce Work-Related Accidents and Save Money" Online 2003, XP002353502, http://www.can-cia.org/devicenet/CIPWh.
"Notification of Transmittal of International Search Report and Written Opinion" for PCT/US2004/037289.
"Notification of Transmittal of the International Search Report and the Written Opinion of the International Searching Authority, or the Declaration" for PCT/US2006/009604.
Computer—From Wikipedia, the free encyclopedia; http://en.wikipedia.org/wiki/Computer; date Sep. 29, 2006; 12 pages.

* cited by examiner

PROCESS CONTROL LOOP CURRENT VERIFICATION

The present application is a Continuation-In-Part of and claims priority of U.S. patent application Ser. No. 10/733,558, filed Dec. 11, 2003, which is a Continuation-In-Part U.S. patent application Ser. No. 10/635,944, filed Aug. 7, 2003 now U.S. Pat. No. 7,018,800, the contents of which are hereby incorporated by reference in their entirety.

BACKGROUND OF THE INVENTION

The present invention relates to process devices of the type used in industrial processes. More particularly, the present invention relates to devices such as transmitters which control electrical current in a process control loop.

Field devices such as process controllers, monitors and transmitters, are used in the process control industry to remotely control, monitor or sense a process variable. For example, a process variable may be transmitted to a control room by a transmitter for use in controlling the process or for providing information about process operation to a controller. For example, information related to pressure of process fluid may be transmitted to a control room and used to control the process, such as oil refining.

One typical prior art technique for transmitting information involves controlling the amount of current flowing through a process control loop. Current is supplied from a current source at a location such as in the control room, and the transmitter controls the current flowing in the loop from its remote location in the field. For example, a 4 mA signal can be used to indicate a zero reading and a 20 mA signal can be used to indicate a full scale reading. More recently, transmitters have employed digital circuitry which communicates with the control room using a digital signal which is superimposed onto the analog current signal flowing through the process control loop. One example of such a technique is the HART® communication protocol developed by Rosemount Inc. The HART® protocol and other such protocols typically include a set of commands or instructions which can be sent to the transmitter to elicit a desired response, such as transmitter control or interrogation.

When an analog loop current is used to represent information such as a process variable, the accuracy at which the loop current can be set can be a limiting factor on the accuracy of the transmitted process variable. The controlled loop current may be susceptible to drifting. In other words, the controlled loop current can change value over time as electrical components that control the current tend to age.

SUMMARY

A process device is configured for coupling to a two wire process control loop. Loop current output circuitry is configured to apply an output current to the two wire process control loop. Loop current verification circuitry is coupled to the two wire process control loop and configured to detect errors in the applied output current. At least a portion of the loop current verification circuitry is independent from the loop current output circuitry.

DETAILED DESCRIPTION

The present invention provides an analog loop current verification technique for verifying that the current applied to a process control loop by a process device is set to a desired value. Loop current verification circuitry is used to detect errors in an applied current output level. At least a portion of the loop current verification circuitry is independent from circuitry used to set the loop current on the process control loop. This provides independent (or redundant) verification of the process control loop current. The invention can be implemented in any process device which is used to control current in a process control loop and is not limited to the illustrative process device discussed herein. For example, one process device described herein is a transmitter which includes a sensor for sensing a process variable. The transmitter controls the current flowing through the process control loop to an analog value which is representative of the sensed process variable. However, it is not necessary for a process device to sense a process variable in order to implement various aspects of the present invention. Based upon the results of the loop current verification, various steps can be taken such as the sending of an alarm signal, adjustment of loop current as desired, etc. Examples of such steps are described in U.S. patent application Ser. No. 10/733,558 filed Dec. 11, 2003 entitled PROCESS DEVICE WITH LOOP OVERRIDE.

Figure 1:
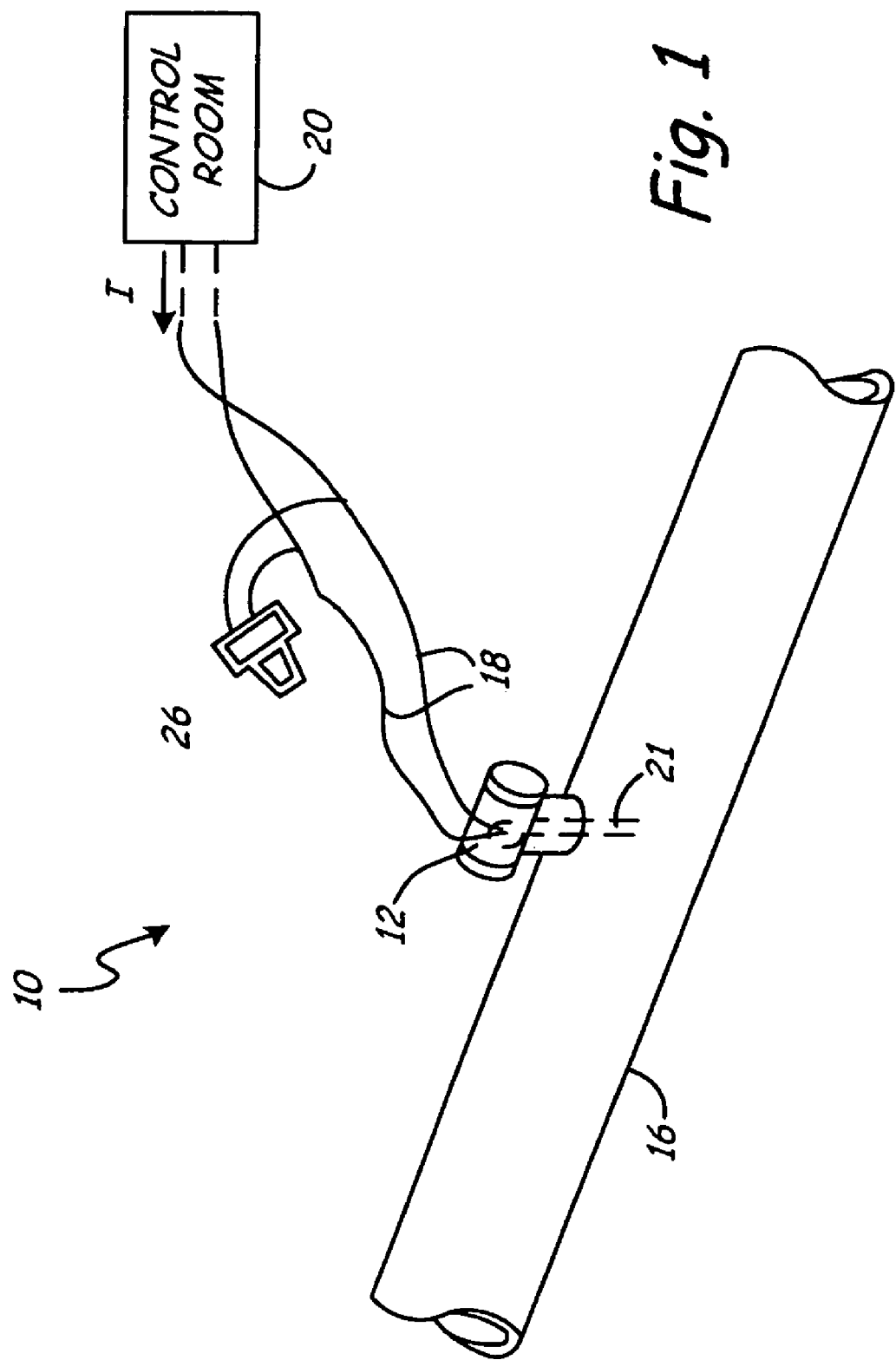
FIG. 1 is a diagram of process control system 10 which includes a transmitter connected to process pipe.

FIG. 1 is a diagram of process control system 10 which includes a transmitter 12 connected to process pipe 16. Transmitter 12 is coupled to a two-wire process control loop 18 which operates in accordance with the FOUNDATION™ Fieldbus, Profibus, or HART® standard. However, the invention is not limited to these standards or a two-wire configuration. Two-wire process control loop 18 runs between transmitter 12 and the control room 20. In an embodiment in which loop 18 operates in accordance with the HART® protocol, loop 18 can carry a current I which is representative of a sensed process variable. Additionally, the HART® protocol allows a digital signal to be superimposed on the current through loop 18 such that digital information can be sent to or received from transmitter 12.

Figure 2:
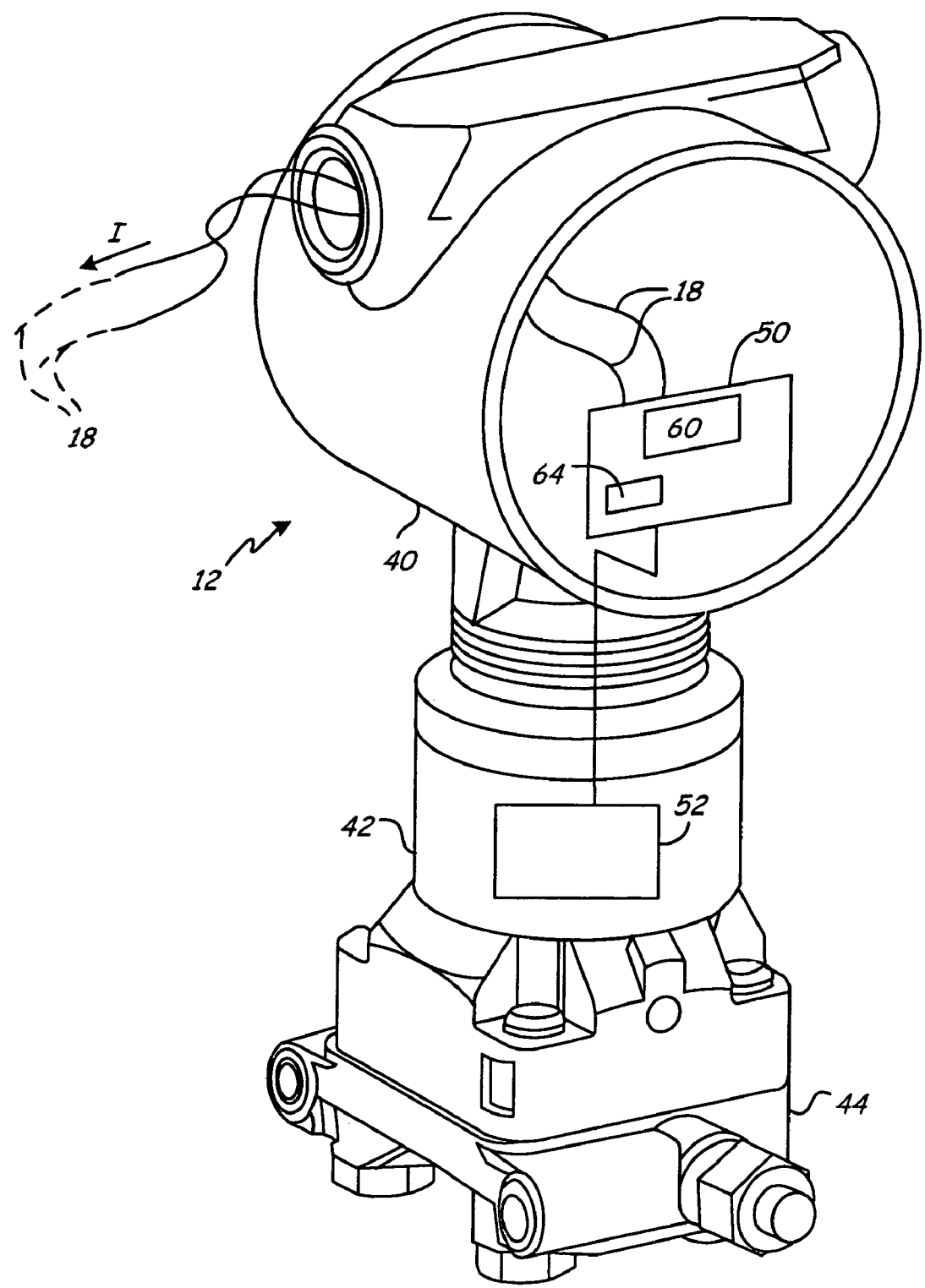
FIG. 2 is a perspective view of a transmitter which shows one example configuration of circuitry blocks carried therein.

FIG. 2 is a perspective view of transmitter 12 which shows one example configuration of circuitry blocks carried therein. In this example embodiment, transmitter 12 includes a feature module 40 which couples to a sensing module 42. The sensing module 42 couples to process piping 16 (shown in FIG. 1) through manifold process coupling 44.

Feature module 40 includes feature module electronic circuitry 50 which couples to sensing module electronic circuitry 52 carried in sensing module 42. Typically, the sensing module electronic circuitry 52 couples to a process variable sensor, for example sensor 21 shown in FIG. 1, which is used to sense a process variable related to operation of the process. Feature module electronic circuitry 50 includes loop current output circuitry 60, and loop current verification circuitry 64. The circuitry 64 can be implemented in hardware, software or a hybrid combination of the two and can be located anywhere within transmitter 12. At least one component or function of circuitry 64 is at least partially separate or independent from circuitry of circuit 64.

During operation, loop current output circuitry 60 controls the value of the current I flowing through loop 18 to represent, for example, a measured process variable. This can be used to monitor or control operation of an industrial process. In some applications, output circuitry 60 is also used to provide power to circuitry within transmitter 12 which is generated using power received over loop 18. In some applications, such as for obtaining a Safety Integrity Level (SIL) certification, it is necessary for the transmitter 12 to meet certain reliability criteria. For example, in order to ensure that a process is shut down upon a failure or impending failure, some certifications require that an alarm signal be properly sent so that a safety shut down can occur even if some of the components have failed in transmitter 12. The loop current verification circuitry 64 can be applicable to such a configuration.

Figure 3:
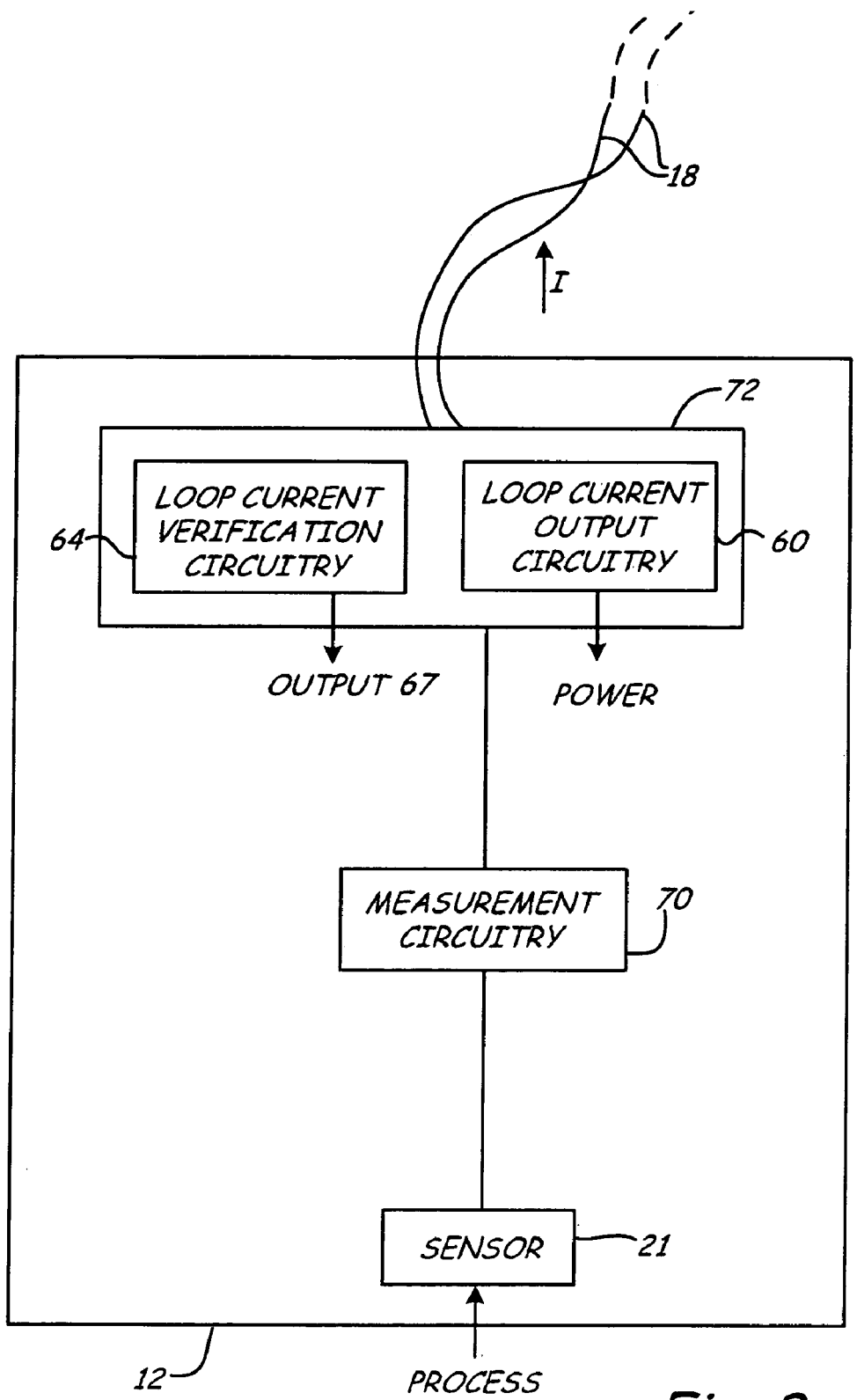
FIG. 3 is a simplified block diagram of transmitter.

FIG. 3 is a simplified block diagram of transmitter 12. As shown in FIG. 3, transmitter 12 includes measurement circuitry 70 which couples to process variable sensor 21. Circuitry 70 can be included in sensor module circuitry 52 shown in FIG. 2. An output stage 72 connects to measurement circuitry 70 and is configured for sending (and, in some embodiments, receiving) information over process control loop 18. The output stage 72 includes output circuitry 60. However, circuitry 60 can be configured in accordance with other embodiments. The measurement circuitry 70 is configured to provide initial processing of process variables sensed by sensor 21. The implementation of measurement circuitry 70 frequently includes a microprocessor. The microprocessor may also be used to implement other circuit functionality of the transmitter 12.

During normal operation, the process variable sensed by sensor 21 is converted into an analog loop current for transmission on process control loop 18 using output circuitry 60. The loop current verification circuitry 64 can be connected in series, parallel, or series-parallel with output circuitry 60 or included in circuitry 60. Other configurations can also be used.

The loop current verification circuitry 64 includes at least one component which is partially independent or independent from the components used by loop current output circuitry 60. The loop current verification circuitry 64 compares the current I flowing through loop 18 with the intended value of the current and responsively provides a comparison output 67 related to the comparison. For example, an output 67 can be provided if the loop current I is outside of a predetermined or adjustable threshold of its intended value. These comparisons can be based upon a fixed discrepancy, or based upon a percentage discrepancy, or other relationship with the intended value of the output current I. Further, the output 67 can be an indication of the amount of error, in absolute or relative terms, of the actual output loop current I versus the desired output loop current.

In order for loop current verification circuitry 64 to compare the loop current I with the desired value of the loop current, the circuitry 64 must have information related to this desired value. This could be, for example, by a connection to measurement circuitry 70, or other circuitry within transmitter 12, which provides the loop current verification circuitry 64 with information related to this desired level. In another example, transmitter 12 can enter a test mode in which the loop current I through loop 18 is set to one or more predetermined loop currents, or through a pattern of loop currents. During this test mode, the loop current verification circuitry 64 can compare the actual loop current flowing through loop 18 with the desired loop current. An appropriate output can be given based upon this comparison, for example analog alarm or digital value via HART. In other examples, a difference (between an actual and intended loop current) can be annunciated through a local display such as an LCD readout of the difference value or transmitted as a digital value in response to a HART request. If a difference exceeds a particular threshold, or other criteria, this information can be annunciated by displaying a local error message, transmitting a digital error message in response to a HART request, transmitting a digital error message in a HART burst mode (additional status), providing an analog alarm or providing an analog pattern output on the control loop. Output correction can be used to modify a value sent to the digital to analog convertor to compensate for the difference value. An auto calibration routine can also be initiated. In other configurations, a diagnostic output can be provided, for example, if the difference exceeds a threshold. This difference can be annunciated by, for example, a visual indicator or a contact closure. Other transmitter configurations can also be used such as a diagnostics HART 4–20 mA output. For example, the output mode can be switched and the diagnostic output can be provided on the analog loop. In other transmitter configurations such as those which include wireless capabilities, a wireless response can be sent in response to a request or initiated by the transmitter.

Figure 4:
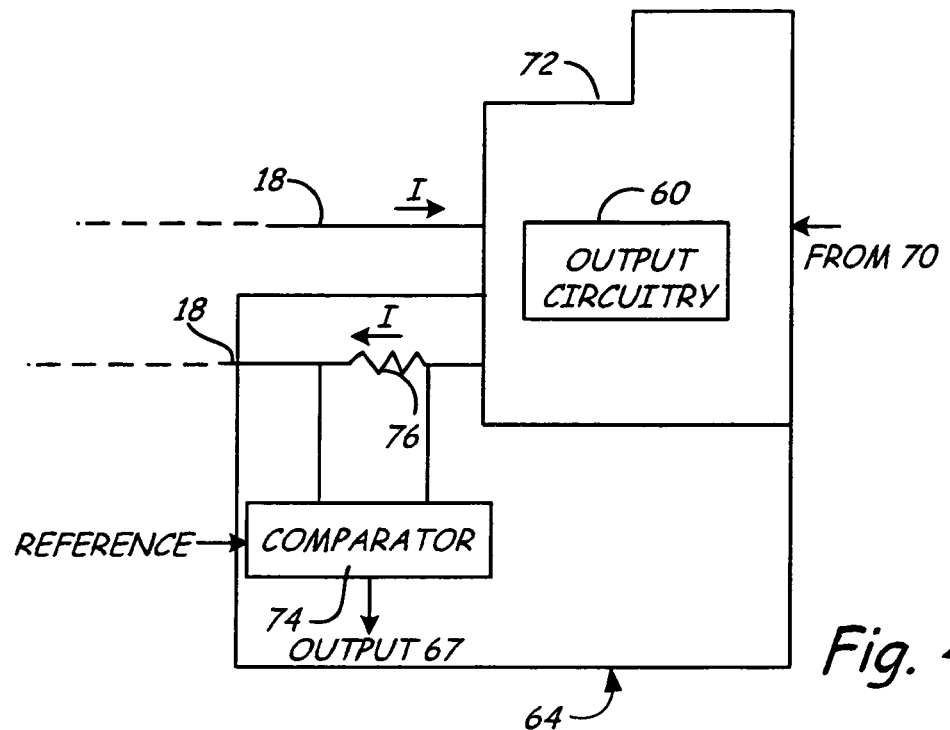
FIG. 4 is a simplified block diagram showing one embodiment of loop current verification circuitry.

FIG. 4 is a simplified block diagram showing one embodiment of loop current verification circuitry 64. In FIG. 4, a comparator 74 is used to sense a voltage drop across a resistor 76 which is connected in series with loop current I. The comparator 74 can be configured to detect variations in the loop current beyond predetermined error levels as set by the "REFERENCE" input and responsively provide an output signal. The comparator 74 can comprise multiple comparators, for example, to detect current excursions beyond upper and lower error thresholds. The reference input to comparator 74 can be generated using any appropriate means, for example, a resistor ladder network, diode, or other techniques, including microprocessor control. For example, the reference can be set using a digital to analog converter.

Figure 5:
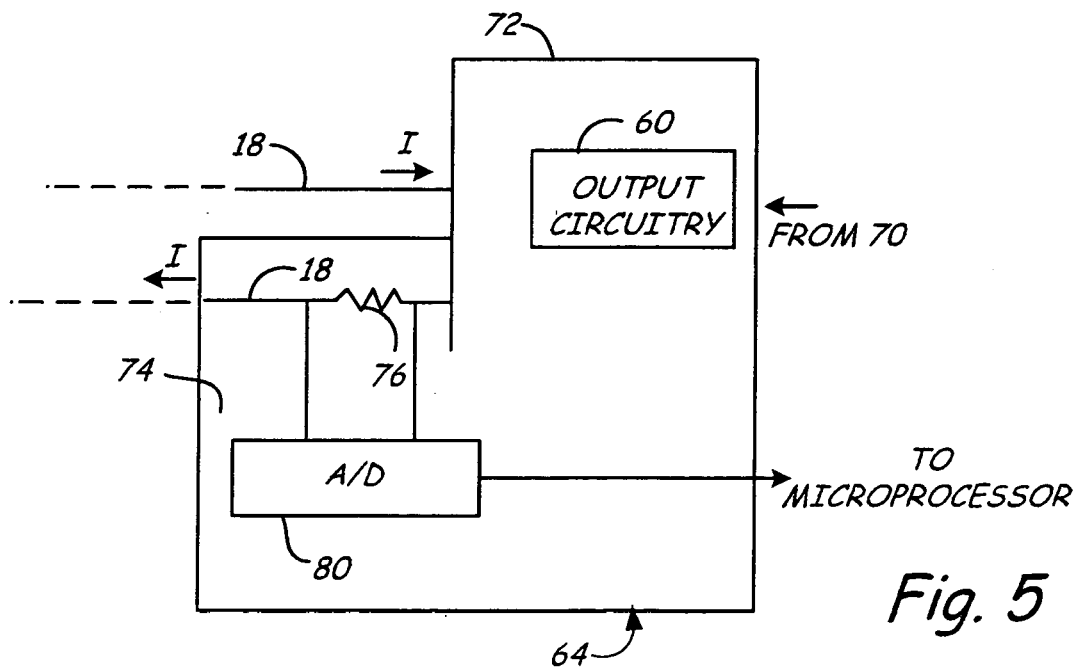
FIG. 5 is a simplified diagram showing another embodiment of the present invention in which loop current verification circuitry is formed using an analog to digital converter connected across a resistor.

FIG. 5 is a simplified diagram showing another embodiment of the present invention in which loop current verification circuitry 64 is formed using an analog to digital converter 80 connected across the resistor 76. As discussed above, resistor 76 is coupled in series with loop 18 such that the voltage drop across resistor 76 is indicative of the loop current I. The output from analog to digital converter 80 can couple to, for example, a microcontroller 92 shown in FIG. 6. The microprocessor compares the digitized loop current value with thresholds stored in a memory and responsively provides an output based on the comparison. In another example, the microprocessor can compare the digitized loop current value with expected loop current value. For example, the expected loop current value can be the value that the loop current should be set to for a particular value of the sensed process variable. If the sensed loop current value varies from the expected loop current value by more than a predetermined amount, for example a percentage, the microprocessor can provide an indication that the loop current cannot be verified. The microprocessor can optionally be considered part of the current verification circuitry 74.

Figure 6:
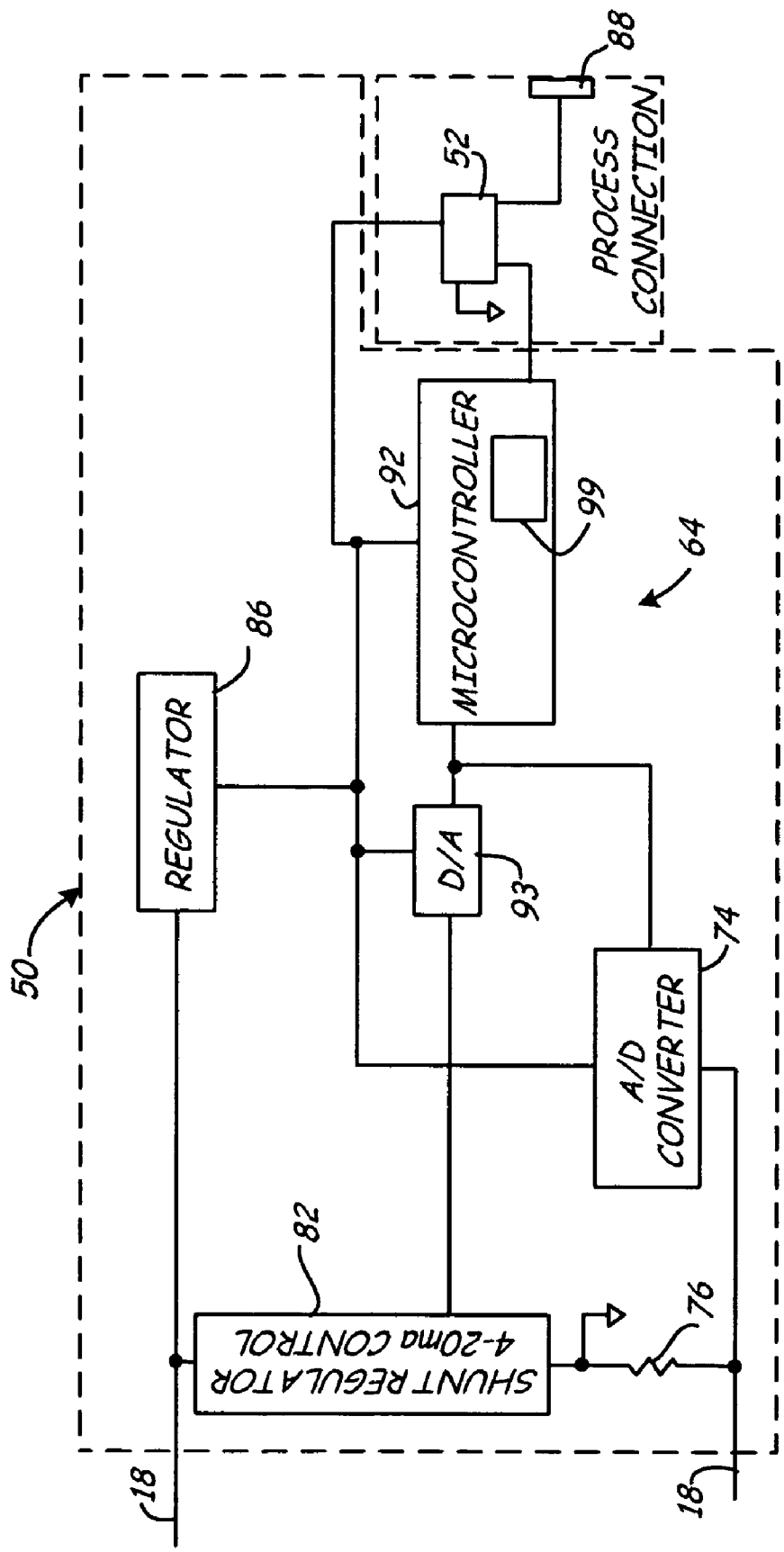
FIG. 6 is a simplified electrical diagram of one embodiment of the invention.

FIG. 6 is a more detailed block diagram showing one example of circuitry in transmitter 12. In FIG. 6, feature module electronics 50 is shown coupled to two wire process control loop 18 through a shunt regulator 82 and a loop feedback resistor 76. A power regulator 86 couples to sensor module electronics 52. Sensor module electronics 52 is also shown coupled to the process through a process variable sensor 88.

The loop current verification circuitry 64 can be partially implemented in microcontroller 92 which couples to a digital to analog (D/A) converter 93 and an analog to digital (A/D) converter 74. (Note "microcontroller", "microprocessor" and "processor" are used interchangeably herein.) Analog to digital converter 74 is configured to measure the loop current and can also implement the functionality of loop current verification circuitry 64.

In operation, the microcontroller 92 is configured to control the current I through loop 18, and any digital data modulated onto that current, using D/A 93 and shunt regulator 82. The analog to digital converter 74 provides an output which is indicative of the current I flowing through loop 18. The microcontroller 92 includes a memory 99 which can contain one or more threshold values or other current relationship used in detecting an alarm condition. By periodically comparing the measured loop current with the threshold values stored in memory 99, or with the expected value of the loop current based upon the sensed process variable, the microcontroller 92 can determine if an error has occurred.

With the present invention, field devices are provided a technique to detect changes in an analog output by accurately reading the loop current and comparing it to a set or expected value. By comparing the measured value to the expected value, the device can detect changes in the loop current over time, for example due to drift of components. If excessive difference between the measured current and the expected current are detected, an output can be provided, for example over loop 18, indicating that maintenance is required. In such a situation, the transmitter can be recalibrated (manually or automatically) and the loop current verification circuitry used for subsequent error detection. In another example, a periodic query can be provided by, for example, a digital communicator 26 as shown in FIG. 1 to request the health of the analog current loop. If the response indicates that there is no substantial drift error, the operator can make a determination that the device is operating properly and does not require service. This reduces the maintenance intervals, cost of maintenance, amount of time spent servicing transmitters, and the likelihood that an error is introduced due to unnecessary maintenance. In another example, the invention can be used in a digital communications system by monitoring the loop current in such an installation. The current can be related to expected current and the result communicated digitally.

In one configuration, a precision reference is used and the microcontroller 92 is configured for self calibration of the transmitter 12. For example, the microcontroller can adjust the loop current such that it matches the reference loop current. A comparison to such an absolute reference can be used with a mathematical correction or equation to correct the loop current without requiring measurements to be taken at the end points of the loop current extremes.

Figure 7:
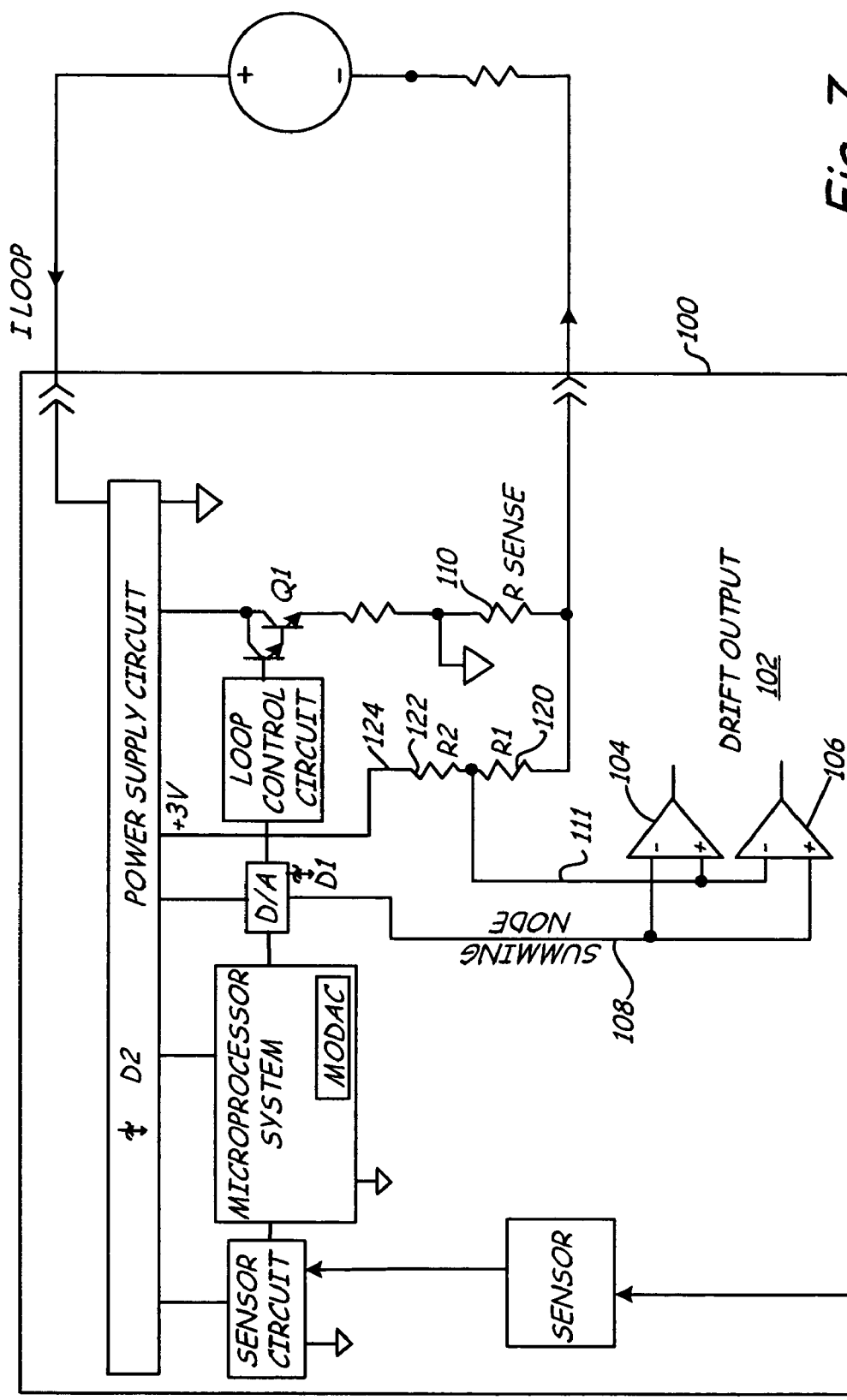
FIGS. 7, 7A and 7B provide somewhat more detailed views of electronics in a transmitter for implementing embodiments of loop current verification circuitry.

The above discussion provides various example techniques for implementing the loop current verification circuitry. FIG. 7 illustrates a first embodiment that provides a somewhat more detailed view of electronics in a transmitter 100 for implementing current verification circuitry and providing a drift output 102. The drift output 102 is generated by comparators 104, 106. Comparators 104, 106 sense a difference between a summing node voltage on line 108 and a voltage on line 111 that is derived from a sense resistor 110. The sense resistor 110 conducts a loop current I LOOP and generates a voltage VSENSE relative to a common return ("DC common") indicated by a small triangle symbol. Comparators 104, 106 are energized by and operate between a positive voltage rail 112 and a common return ("DC common") 114. In order for comparators 104 and 106 to operate properly, the two compared voltages on the lines 108, 111 must both have voltages that are also between the positive voltage rail and the common return.

The voltage VSENSE generated at the sense resistor 110, however, is negative relative to the common return 114 and therefore outside the operating range of the comparators 104, 106. In order to present a voltage on line 111 that is within the operating range, a resistive divider network comprising resistor (R1) 120 and resistor (R2) 122 are connected in series between the voltage VSENSE and a +3V supply voltage on line 124. The resistive divider network acts to "pull up" the voltage on line 111 so that the voltage on line 111 is in the operating range. The line 111 is connected to a node between resistors 120 and 122 and provides a voltage on line 111 that is positive. The voltage presented on line 111, is functionally dependent on VSENSE.

The voltage change presented on line 111 also has a relatively low amplitude change, as an example in the range of about 270 millivolts change for a loop current change from 4 to 20 milliamperes through a 25 ohm sense resistor RSENSE. In the configuration of FIG. 7, the loop current (Iloop) is a scaled output proportional to the measured process variable. This output is calculated from the sensor input and scaled and compensated for temperature effects in the microprocessor system. The compensated value is then used to generate the Iloop value using the digital to analog convertor and related circuitry. The reference D1 is used by the digital to analog convertor to provide an accurate value to the summing node, which is used to provide the control signal to Q1, the pass element in the current loop. Because the voltage at the summing node is also proportional to the Iloop value, this voltage can be measured to determine the accuracy of the loop current output.

Use of a comparator circuit, 104 and 106, creates a simple pass fail indicator for the upper and lower limits of Iloop. The reference voltage is developed from a resistor divider R1 and R2 connected between the 3V power supply and the negative terminal. This voltage includes the drop across Rsense (110) which is proportional to the loop current Iloop. The 3V power supply is developed using a reference D2 that is independent of the reference used by the digital to analog convertor circuit. R1 and R2 are scaled to provide a voltage proportional to the summing node and loop current output.

Any drift in the circuitry would be indicated by a difference in voltage between the summing node and the voltage developed with R1 and R2. The respective comparator would then indicate the direction of the drift. In the case of the loop output drifting high, comparator 106 would indicate a high output. In the case of the loop output drifting low, comparator 104 would indicate a high output. The outputs of the comparators (102) could be fed back to the microprocessor so an indication could be sent to the user.

Figure 7A:
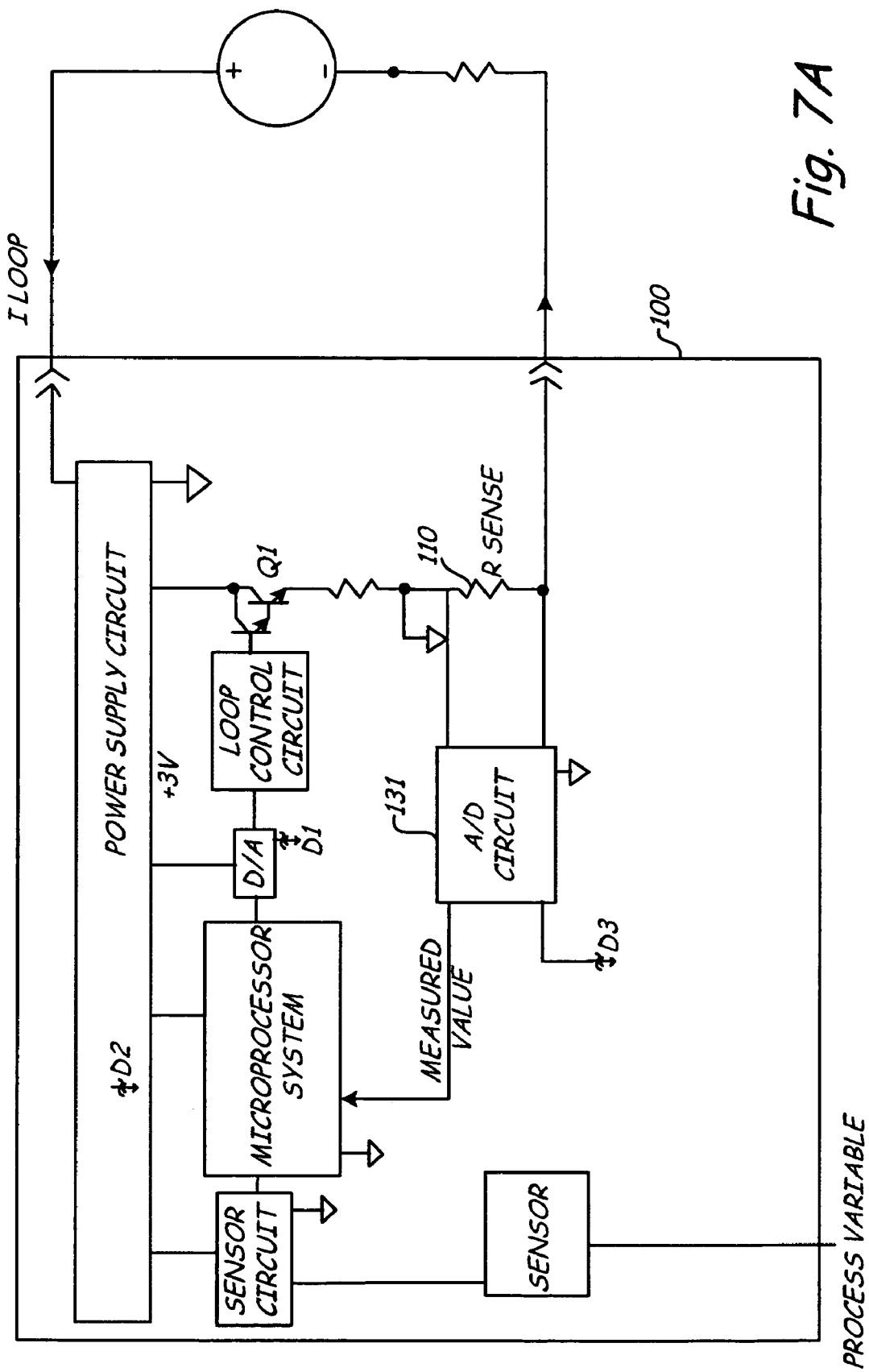

In another example schematic diagram shown in FIG. 7A, an analog to digital converter circuit 131 is used. In this configuration, the loop current (Iloop) is a scaled output proportional to the measured process variable. This output is calculated from the sensor input and scaled and compensated for temperature effects by the microprocessor system. The compensated value is then used to generate the Iloop value using the digital to analog convertor and related circuitry. The reference D1 is used by the digital to analog convertor to provide an accurate value to the summing node, which is used to provide the control signal to Q1, the pass element in the current loop. Rsense is in series with Iloop, so the voltage across the resistor is proportional to the loop current. This voltage can be measured to detect drift using an A/D converter. This A/D converter uses a reference D3 that is independent of the reference used by the digital to analog convertor output. This loop current verification value is then fed back to the microprocessor circuit where it can be compared to the expected Iloop value.

The loop current output circuitry is calibrated at the factory. The loop current verification circuitry can be calibrated at the same time. The loop current may again be calibrated by the end user as part of the installation process. The loop current verification is calibrated at the same time to reduce the error between the output and the measured values.

After the device is installed, the loop current measured value and the loop current expected value will be continually or periodically compared. If there is any drift in the reference or the components in the circuitry used to establish the Iloop output, it will be indicated by the difference between the loop current expected and measured values. This drift can be indicated to the end user by status bits or by transitioning to an alarm condition.

Figure 7B:
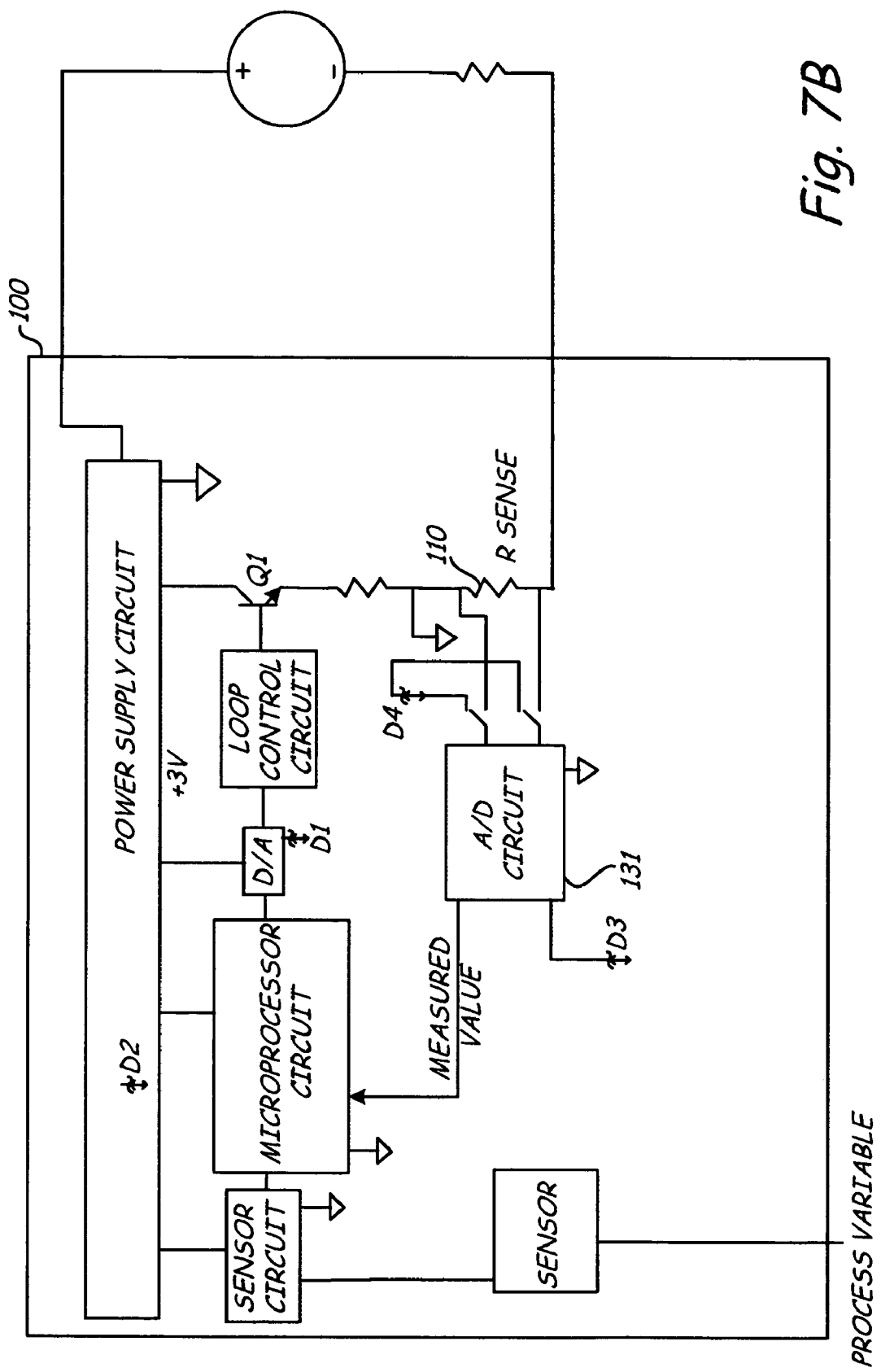

FIG. 7B is yet another example configuration. This configuration is similar to the configuration of FIG. 7A. This configuration includes the capability of switching a reference voltage into the A/D converter input so it can be used to calibrate the Iloop output. When the Iloop output is calibrated, an additional A/D reading is taken across the independent voltage reference (D4). This can be a voltage reference used in a part of the circuit not used for the creation of the Iloop output, or a voltage reference placed specifically for this purpose. The loop current measured value is then compared to the independent voltage reference value. Scaled offset and gain values are calculated for the loop current measured value. This could be a simple a=mx+b calculation, or could also include more involved calculations including linearity and temperature compensation. These scaling factors allow any Iloop output to be compared back to the independent voltage reference reading. The original voltage reference reading and the scaling factors are stored in non-volatile memory such as EEPROM to be used for future calculations. Any time the current loop is calibrated, the calculations would be updated to provide new offset and gain calculations.

After the device is installed, the Iloop measured value and the loop current expected value can be continually or occasionally compared. In addition, the value of the independent reference is measured and compared to its initial stored value.

A difference between the last measured independent voltage reference reading and the original independent voltage reference value indicates a drift in the reference for the A/D converter or the independent reference. In this case, an indication is provided to the end user that loop current calibration is required. During calibration, calibrations are updated providing new offset and gain values.

A difference between the Iloop expected value and the loop current measured value indicates a drift in some of the components used in the analog output circuitry or the reference for the Iloop measurement. If the independent voltage reference reading indicates no change from the original value stored in memory, then the drift can be automatically compensated for without taking the device out of service. The delta between the measured and expected loop current values can be adjusted out by changing the offset and gain values used to set the Iloop value. Once the new values are used to set the output, a loop current measured value can be used to verify the change.

In the embodiments described below in connection with FIGS. 8–14, further discussion of loop current verification is described. The sense voltage is connected to an inverting amplifier input, and an amplified output is positive and between the common return and a positive supply voltage. The use of an inverting amplifier avoids connecting a sense voltage through a resistive voltage divider to a positive rail. The amplifier output generates amplified voltage changes of for example in the range of 800 millivolts change for loop current changes from 4 to 20 milliamperes through a 25 ohm sense resistor RSENSE.

Figure 8:
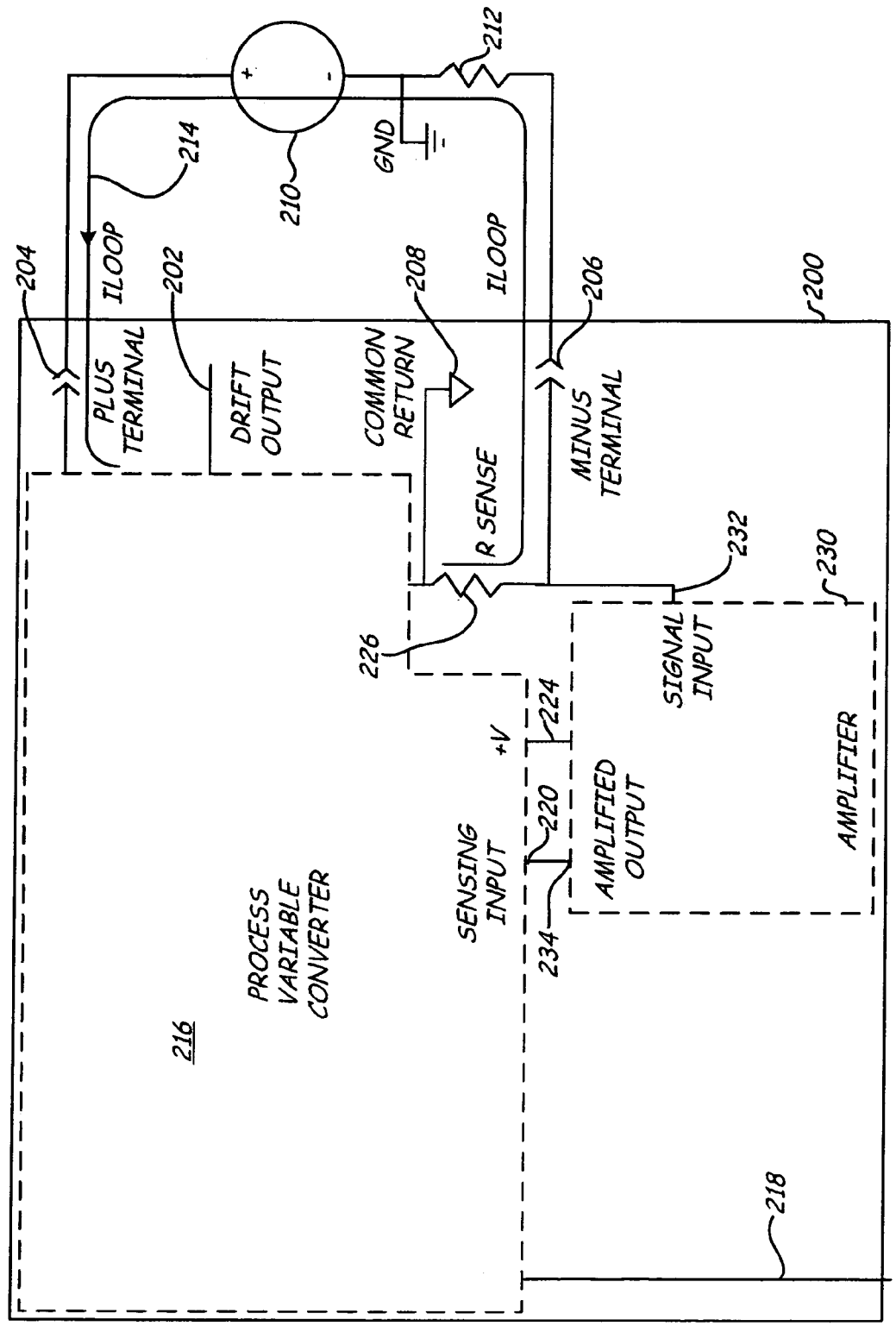
FIG. 8 illustrates another embodiment of a circuit that provides a drift output.

FIG. 8 illustrates one embodiment of a circuit 200 that provides a drift output 202. The circuit 200 comprises a plus terminal 204, a minus terminal 206 and a common return 208 indicated by a triangle symbol. The circuit 200 is preferably part of a process variable transmitter. The plus and minus terminals 204, 206 are accessible for connection in a control loop with an excitation source 210 and an output device 212. The excitation source 210 is preferably a DC power supply and the output device 212 is preferably a control system input that is schematically represented as an input resistance. The control loop carries a loop current (I LOOP) 214 that is preferably a 4–20 milliampere analog current. The loop current 214 preferably provides all of the electrical energization for the circuit 200. The common return 208 is preferably a DC common conductor that is not accessible for connection outside the circuit 200.

The circuit 200 also comprises a process variable converter 216 that conducts the loop current 214 from the plus terminal 204 to the common return 208. The loop current 214 energizes the converter circuit 216. The process variable converter also provides a positive power supply voltage 224. The converter circuit 216 preferably senses a process variable 218 and controls the magnitude of the loop current 214 as a function of a magnitude of the process variable 218. The converter 216 also comprises a sensing input 220 which is preferably a voltage sensing input useful for receiving feedback indicating an actual magnitude of the loop current 214.

The circuit 200 comprises a sense resistance (RSENSE) 226 that conducts the loop current 214 from the common return 208 to the minus terminal 206. The sense resistance 226 preferably has a resistance value of about 25 ohms that is highly stable and does not drift significantly. The common return 208 collects substantially all of the loop current 214 that passes through the process variable converter 216 so that substantially all of the loop current 214 passes through the sense resistance 226. The sense resistance 226 generates a sense voltage at the minus terminal 206 that is representative of the loop current.

The circuit 200 also comprises an amplifier 230 that has a signal input 232 coupled to the minus terminal 206. The signal input 232 has a negative voltage relative to the common return 208. The amplifier 230 has an amplified output 234 that couples to the sensing input 220 to provide feedback. The amplifier 230 is preferably an inverting amplifier that provides the positive amplifier output 234 in response to the negative amplifier signal input 232. The amplifier 230 preferably has a gain of, for example, minus 2 in order to provide an increased signal level on amplified output 234. The amplified output 234 is positive relative to the common return when the loop current is the range of 2.8–28.0 milliamperes. The nominal 4–20 mA loop current range is encompassed by this wider range.

The process variable converter 216 provides the drift output 202 that indicates a difference between a desired value of loop current 214 based on the process variable 218 and an actual value of loop current 214 based on feedback from the sensing resistor 226 and the amplifier 230 as applied at sensing input 220 of the process variable converter. The process variable converter preferably includes a microprocessor or ASIC that is used to calculate this difference. The drift output 202 can be displayed on an LCD readout mounted together with the circuit 200 in a transmitter.

The circuit 200 is preferably enclosed in a housing (not illustrated) to form a process variable transmitter. Process variable transmitters such as pressure transmitters, flow transmitters, temperature transmitters, and other known types of transmitters can be constructed using the circuit 200.

Figure 9:
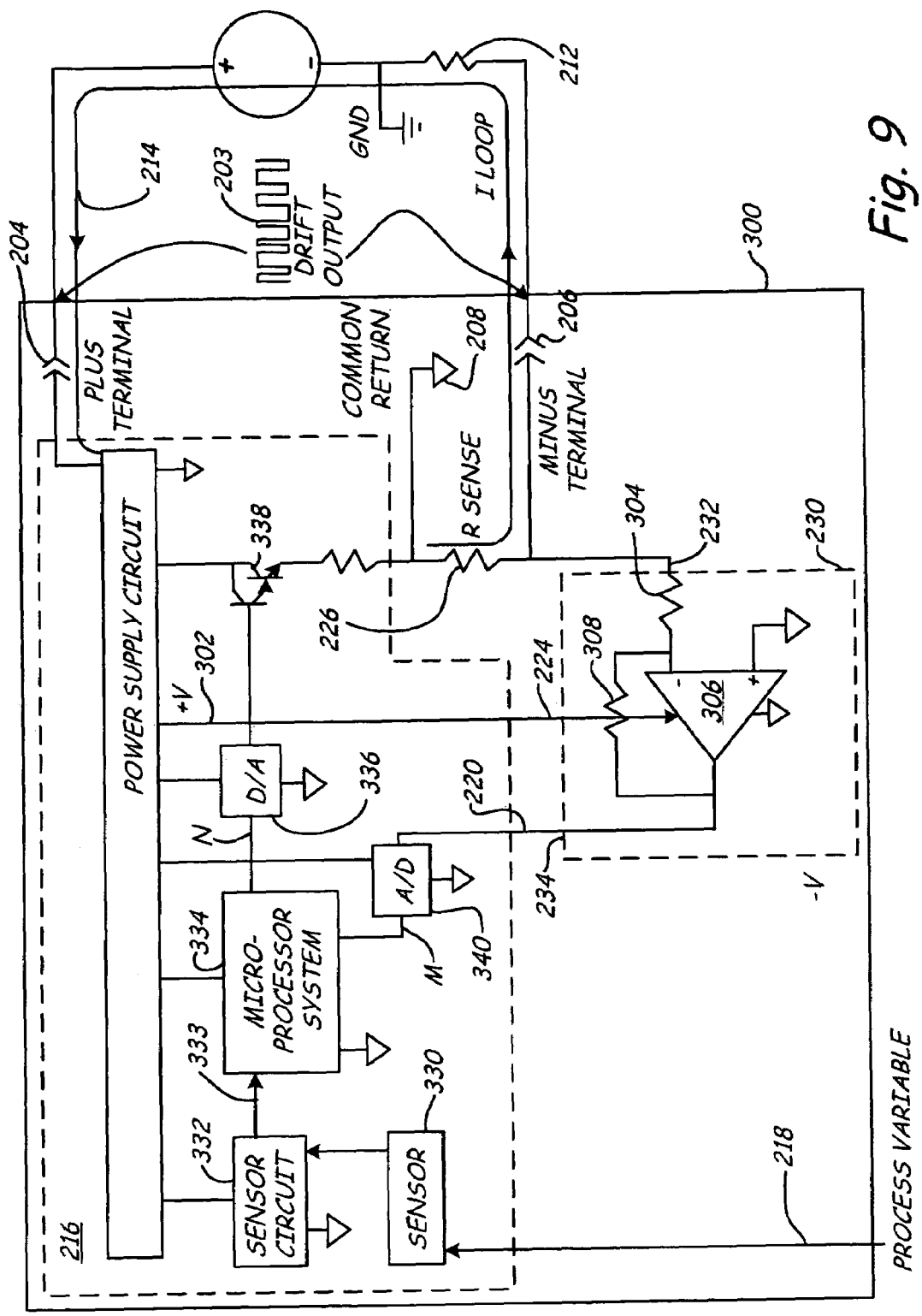
FIG. 9 illustrates another embodiment of a circuit with a drift output.

FIG. 9 illustrates another embodiment of a circuit 300 with a drift output. The circuit 300 illustrated in FIG. 9 is similar to the circuit 200 illustrated in FIG. 8. Reference numbers used in FIG. 9 that are the same as reference numbers used in FIG. 8 identify the same or similar features.

In FIG. 9, the common return 208 is coupled to the amplifier 230, and to the converter 216 as illustrated by triangle symbols. The process variable converter 216 generates a positive power supply potential (+V) 302 that couples to the amplifier 230.

In FIG. 9, the amplifier 230 comprises an input resistor 304 coupled to a signal input 232. The input resistor 304 is preferably at least 1000 times the sense resistance 226 to reduce current leakage into the signal input 232. As an example, the input resistor 304 is 100,000 ohms and the sense resistance 226 is 25 ohms. The amplifier 230 also comprises an operational amplifier 306 having an inverting (−) amplifier input coupled to the input resistor 304. The operational amplifier 306 also has non-inverting (+) input coupled to the common return 208 either directly or through an impedance (not illustrated). The amplifier 230 also comprises a feedback resistor 308 coupled between an amplified output 234 and the inverting input of operational amplifier 306. The operational amplifier 306 has a large open loop voltage gain that is limited to a precise lower gain that is set by a resistive divider network formed of resistors 308, 304. As an example, the resistor 308 has preferably two times the resistance of resistor 304 to provide a gain of −2. The sensing resistor 226, the input resistor 304 and the feedback resistor 308 are all stable, passive components that have negligible drift characteristics.

In FIG. 9, the process variable converter 216 includes a sensor 330 that senses a process variable 218, a sensor circuit 332 that energizes the sensor 330 and provides a process variable output 333 in usable form to a microprocessor system 334. The microprocessor system 334 provides a digital number "N" to a digital-to-analog converter 336 that converts the digital number to an analog current that is fed to Darlington transistor 338 to control loop current 214. An amount of current that is less than 4 mA is used to energize the converter 216, and the Darlington transistor 338 conducts an additional amount of current needed to bring the total current up to the desired value between 4 and 20 mA that represents the process variable 218.

The process variable converter 216 also includes an analog-to-digital converter 340 that converts the amplified output at sense input 220 to a digital number "M" that represents the actual magnitude of the loop current. The analog-to-digital converter 340 preferably comprises a stable, high precision voltage reference so that the circuit 300 can perform its own calibration adjustment without the attention of a technician as described in more detail below in connection with an example illustrated in FIG. 14. The digital number "M" is coupled to the microprocessor system 334 as illustrated. The microprocessor system 334 compares the numbers "M" and "N" to generate a drift output 203 representing a difference between desired loop current and actual loop current. The drift output 203 is a digital signal superimposed on the loop current 214. The drift output is preferably in a standardized format such as the HART protocol.

While the circuit 300 is described in connection with HART protocol communications, it will be understood by those skilled in the art that other known communication protocols such as Fieldbus, CAN, Profibus and the like can be used instead of the HART protocol.

Figure 10:
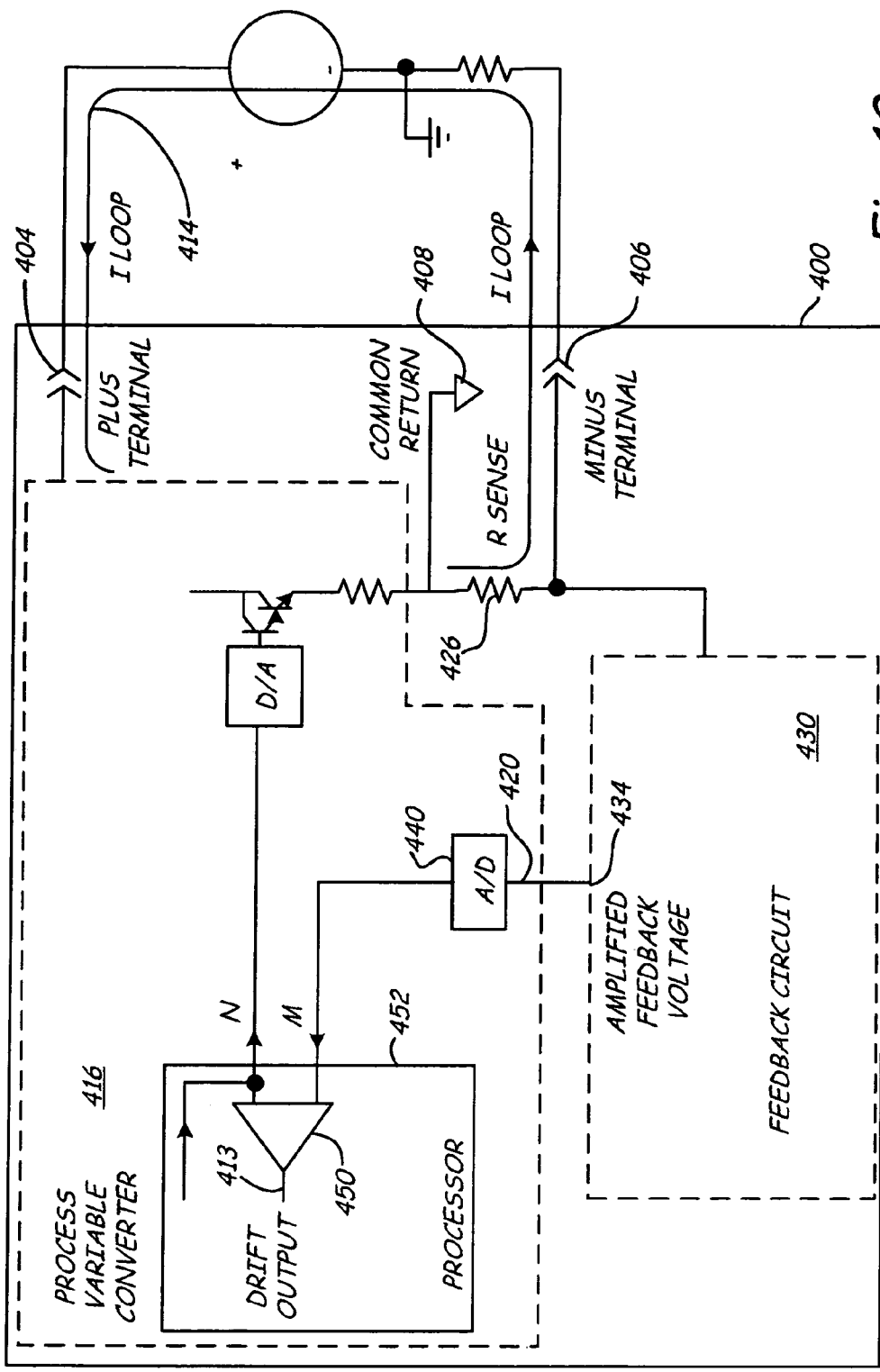
FIG. 10 illustrates another embodiment of a circuit with a drift output 413.

FIG. 10 illustrates another embodiment of a circuit 400 with a drift output 413. The circuit 400 comprises a plus terminal 404 and a minus terminal 406 and a common return 408.

The circuit 400 also comprises a process variable converter 416 that conducts a loop current 414 from the plus terminal 404 to the common return 408. A sense resistance 426 conducts the loop current 414 from the common return 408 to the minus terminal 406.

A feedback circuit 430 senses a voltage at the minus terminal 406 and feeds an amplified feedback voltage 434 back to a sensing input 420 of the process variable converter 416. The amplified feedback voltage 434 represents a magnitude of actual loop current 414. The feedback circuit 430 provides level shifting and amplification so that the amplified feedback output 434 is in a range of values that can be processed by the process variable converter 416.

The process variable converter 416 provides a loop current digital number "N" as a function of a process variable and provides the drift output 413 indicating a difference between the loop current setting "N" and a representation "M" of actual loop current. The representation "M" is obtained from an analog-to-digital converter 440. The analog-to-digital converter 440 senses the amplified feedback voltage 434. A comparator 450 in a processor 452 digitally compares the numbers "M" and "N" and generates the drift output 413. The drift output 413 can be displayed, transmitted to a remote location or used internally by the processor 452 to provide small corrections for drift.

The present invention describes loop current verification circuitry based on a resistor (RSENSE) that creates a voltage (VSENSE) that is a scaled representation of the loop current. For those skilled in the art, other methods of reading loop current are possible. Examples are, but not limited to, current mirrors or wheatstone bridge/nulling circuits.

Figure 11:
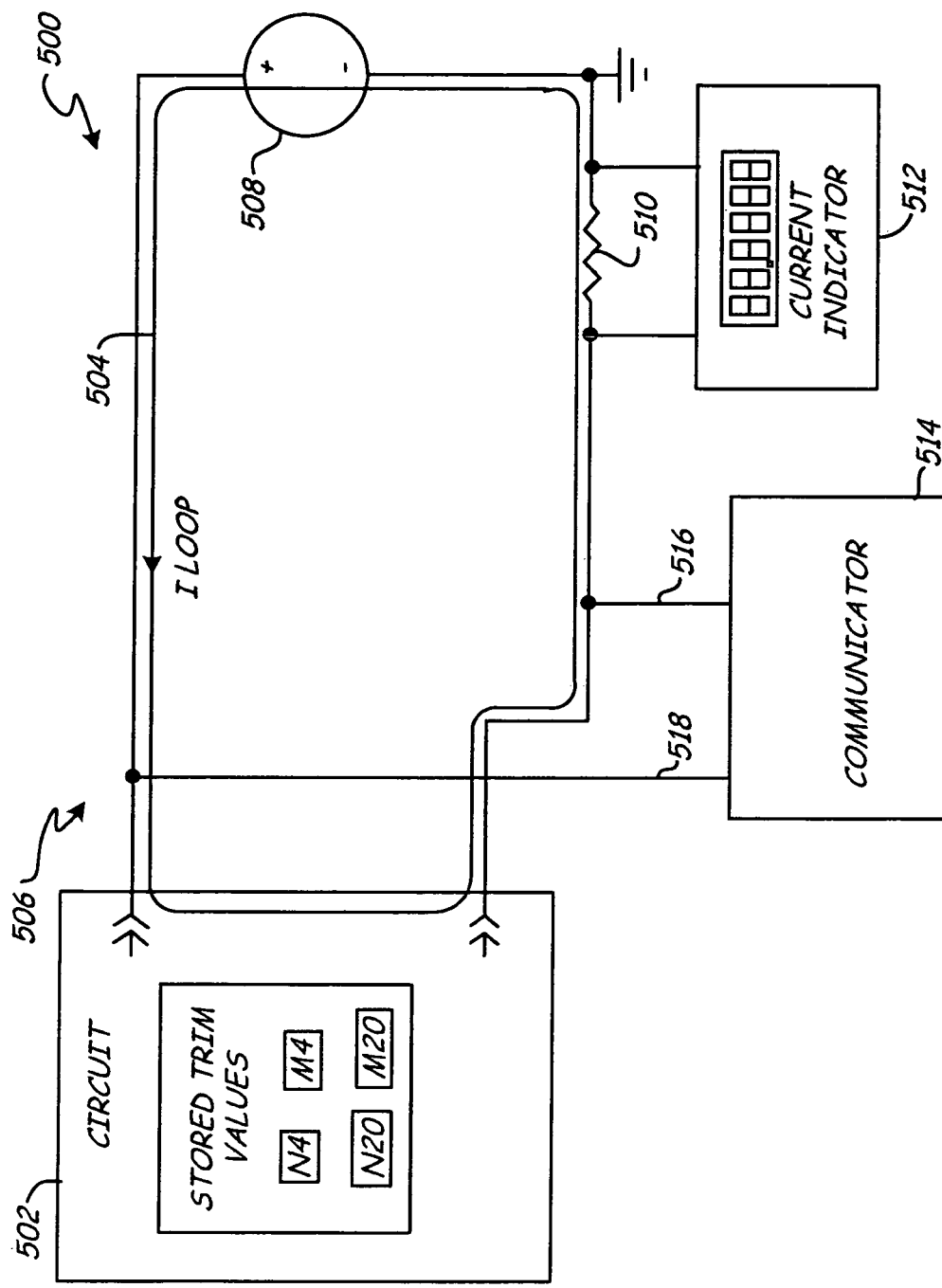
FIG. 11 illustrates a calibration arrangement for calibration of a 4–20 milliampere output and a drift output.

FIG. 11 illustrates a calibration arrangement 500 for calibration of a 4–20 milliampere output and a drift output. A circuit 502 controls a current (I LOOP) 504 that flows in a control loop 506 that extends beyond the circuit 502. The control loop 506 includes a DC power supply 508 and a resistive load 510 connected to a current indicator 512 that can be read by a technician. A communicator 514 is connected to the control loop 506 by leads 516, 518. The communicator 514 is preferably a Rosemount Model 275/375 Communicator that communicates with the circuit 502 using the HART protocol and includes firmware for adjusting trim values N4, N20, M4 and M20 that are stored in the circuit 502. The communicator 514 includes a keypad for adjusting selected trim values up or down as needed. The circuit 502 transmits a drift output using the HART communication protocol, and the communicator 514 receives and displays the drift output on a readout that is part of the communicator 514.

The arrangement shown in FIG. 11 can be used to adjust the trim values N4, N20, M4, M20 stored in the circuit 502 as described below in connection with FIGS. 12–13.

Figure 12:
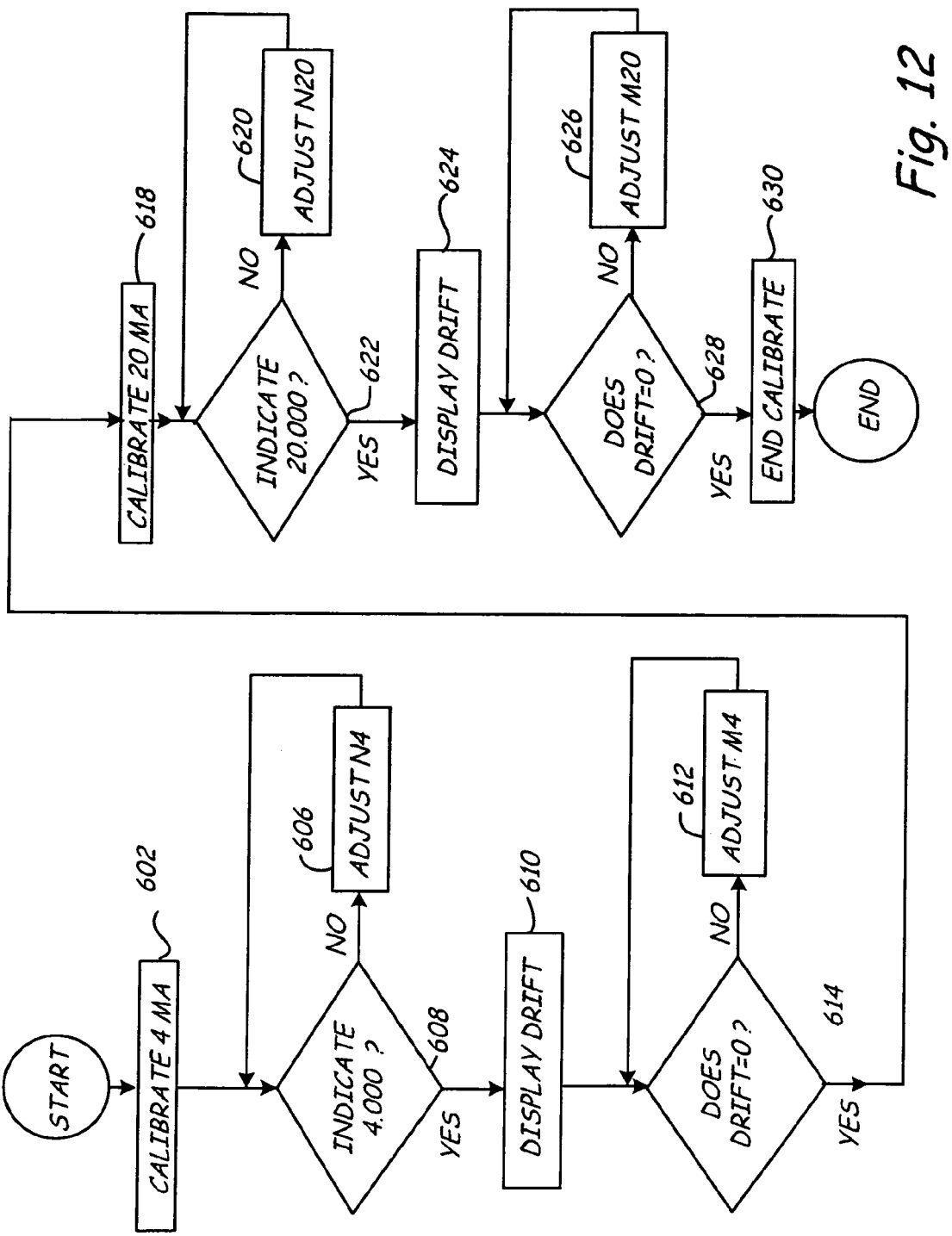
FIG. 12 illustrates a flow chart for calibration of a circuit output and a drift output.

FIG. 12 illustrates a flow chart for calibration of a circuit output and a drift output.

After the loop is energized, the circuit 502 (FIG. 11) is set for calibration of 4 mA current at 602 by the communicator 514. The technician observes the current indicator 512 and uses the keypad on the communicator 514 to adjust or trim the trim value N4 up or down at 606, as needed, until the current indicator indicates 4.000 milliamperes at 608.

Next, the technician uses the keypad to adjust the communicator 514 to display the drift output on the communicator at 610. If the drift output is zero, then no adjustment of M4 is needed. If the drift output is non-zero, the technician can judge whether the value of the drift output is so large that the circuit 502 needs to be repaired. If the drift output is non-zero and within a small normal range of drift, the technician can use the keypad to adjust M4 at 612 so that the indicated drift is zero at 614.

The technician uses the keypad to adjust the communicator to calibrate the circuit for 20 mA loop current at 618. The technician observes the current indicator 512 and uses the keypad on the communicator 514 to adjust or trim the trim value N20 up or down at 620, as needed, until the current indicator indicates 20.000 milliamperes at 622.

Next, the technician uses the keypad to adjust the communicator 514 to display the drift output for a 20 mA current at 624. If the drift output is zero, then no adjustment of M20 is needed. If the drift output is non-zero, the technician can judge whether the value of the drift output is so large that the circuit 502 needs to be repaired. If the drift output is non-zero and within a small normal range of drift, the technician can use the keypad to adjust M20 at 626 so that the indicated drift is zero at 628.

The technician uses the keypad on the communicator 514 to change the circuit 502 from a calibration mode to a service mode at 630. The technician can then place the control loop 506 (FIG. 11) back in service.

Figure 13:
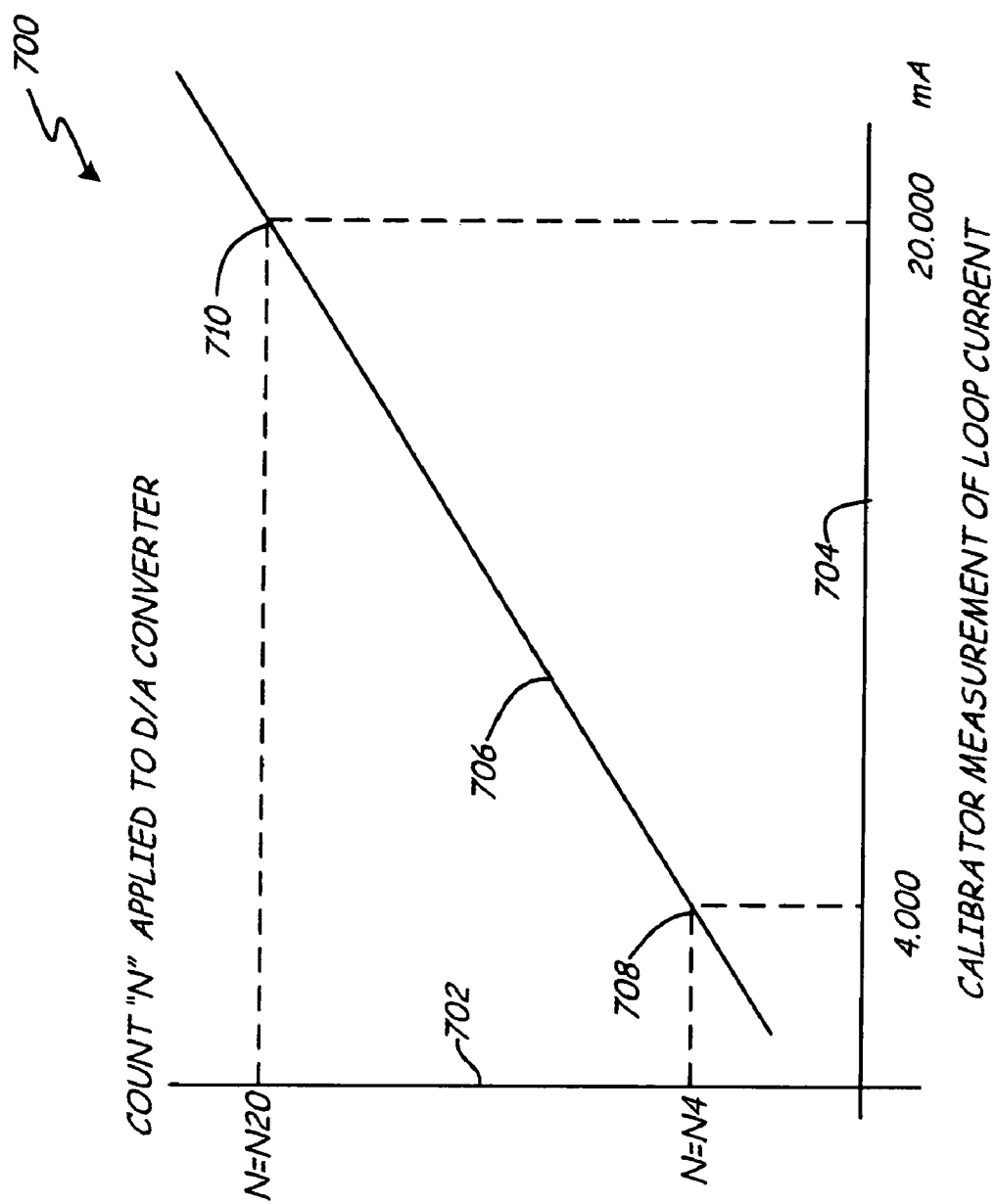
FIG. 13 illustrates a graph of calibration of the circuit after calibration is completed as described above in connection with FIG. 12.

FIG. 13 is a graph 700 of calibration of the circuit 502 output after calibration is completed as described above in connection with FIG. 12. In FIG. 13, a vertical axis 702 indicates a digital number or count N applied to a D/A converter such as D/A converter 336 in FIG. 9. A horizontal axis 704 indicates loop current in milliamperes. A straight line 706 indicates the loop current as a function of the count N after calibration is completed. As shown at point 708, the count N4 has been adjusted so that the loop current is 4.000 milliamperes when N=N4. As shown at point 710, the count N20 has been adjusted so that the loop current is 20.000 milliamperes when N=N20. After calibration, the drift output indicates a substantially zero value at both points 708, 710 and also over the entire range of line 706 during operation. It will be understood by those skilled in the art that the line 706, when highly magnified, has a stairstep appearance due to the resolution of the D/A converter.

If, some time after calibration, the full scale or zero of the D/A circuit drifts, then the drift output will indicate a non-zero value. The drift output is communicated over the current loop by the HART protocol to the control room (or to a communicator) where it can be observed by a technician. The technician can judge whether the drift is large enough to indicate repair of the circuit.

Figure 14:
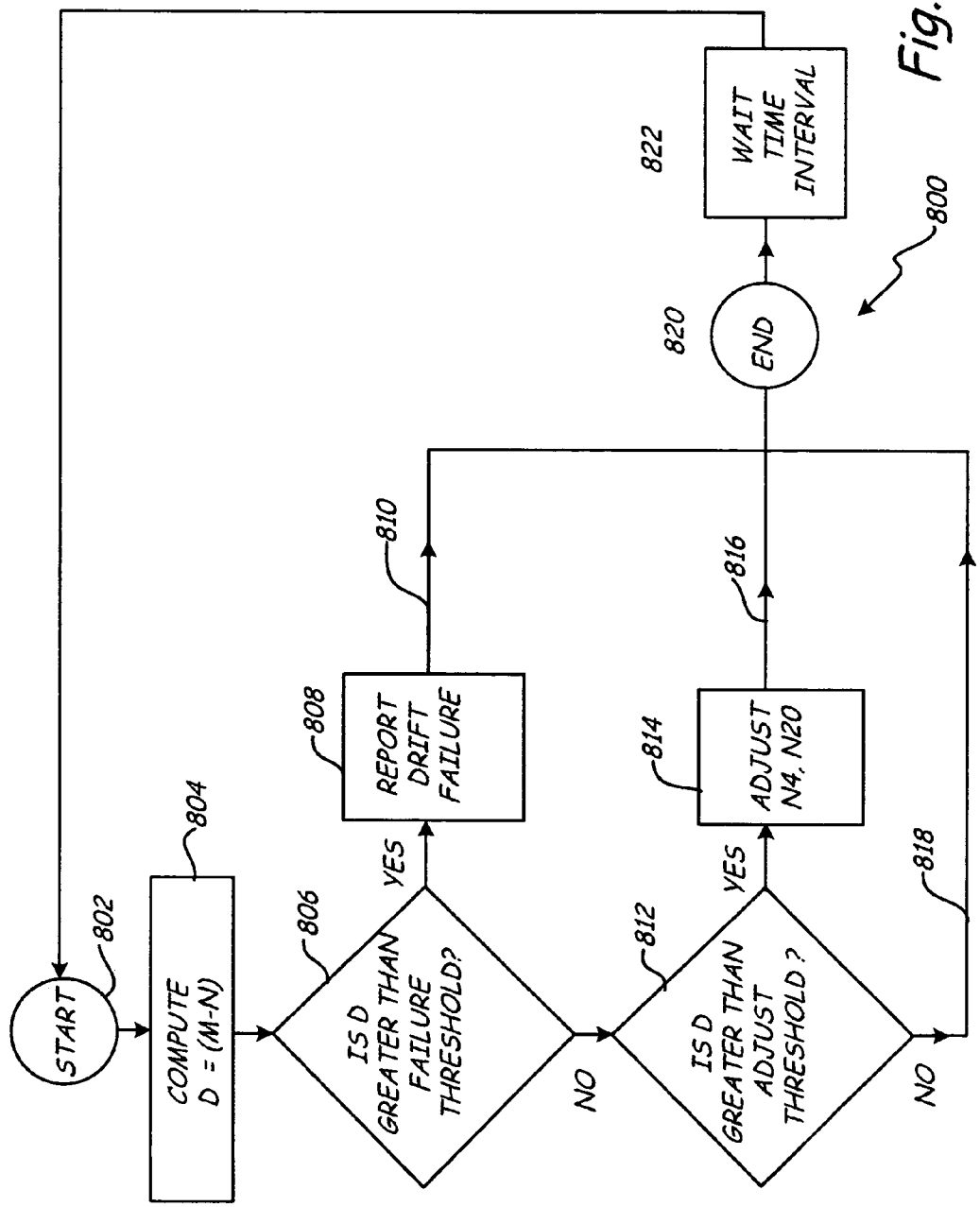
FIG. 14 illustrates a flow chart for automatically handling a drift output.

FIG. 14 is a flow chart 800 for automatically handling a drift output D. A circuit, such as the circuit 300 illustrated in FIG. 9, can include a software routine stored in the microprocessor system 334 (FIG. 9) that automatically compares drift to multiple limits on drift and takes actions automatically based on the multiple comparisons. Starting at 802 in FIG. 14, the program flow continues to calculation block 804 which calculates drift D=(M−N) where N is a number representing desired loop current and M is a number representing actual loop current.

Program flow continues to decision block 806 which tests whether the drift D is greater than a failure threshold. If the drift D is greater than the failure threshold, then program flow continues to block 808 which provides a drift failure report. The drift failure report can be shown on a display mounted to the circuit, or it can be a HART communication signal transmitted over the control loop. After the failure report is completed, then program flow continues along line 810 back to the end 820. Additionally, the other alarm and annunciation techniques discussed above can be used.

If the drift D is not more than the failure limit, then program flow continues from decision block 806 to decision block 812. Decision block 812 tests whether the drift D is greater than an adjustment threshold. If the drift D is greater than the adjustment threshold, then program flow continues to block 814 to automatically adjust N4 and N20 as needed to return the drift output to zero. A field device that includes this automatic adjustment can therefore automatically calibrate itself without the attention of a technician. After the adjustment at block 814, program flow continues along line 816 to the end 820. If D is not greater than the adjustment threshold at decision block 812, then program flow continues along line 818 to the end 820.

The program flow illustrated in FIG. 14 is performed at timed intervals so that a small amount of drift in the time interval, which is normal, can be corrected, but an excessive amount of drift will be reported. After the end 820, there is a wait for the desired time interval at 822 before returning to start 802. The wait time interval is typically one month, but can be adjustable to other time intervals. The failure and adjustment thresholds can also be adjustable.

With the present invention, the circuitry is configured to reduce common cause failures. The circuitry used for measurement of the loop current is preferably designed such that hardware and software aspects of the circuitry incorporate independence from one another. For example, a separate voltage reference (as compared to the voltage reference used by the loop current generation circuitry) can be used, or a diverse data range implemented. The objective is to prevent or reduce situations where a fault causes the same response in both the loop current output circuitry and the loop current verification circuitry. For example, if the same resistor is used for loop current output and loop current verification, and if the data ranges are the same, drift in the shared resistor will affect each circuitry in a similar manner. In this situation, the loop current would not be the intended value, while at the same time the verification circuitry would be unable to detect the error.

With the present invention, an output or action can be provided in response to the loop verification circuitry. These include, for example, providing an alarm including an analog alarm, providing a visual, digital or wireless indication, compensating for errors (correcting the output) or initiating an automatic calibration procedure to recalibrate the device. The loop current verification circuitry can operate in accordance with any technique. For example, the circuitry can compare the measured loop current with a baseline value stored in a memory, including comparing a measured independent reference value to a stored value. The device can indicate that an output measured from the reference value deviates from the stored reference value. The device can also store new current loop calibration data when a manual calibration is performed as well as new independent reference data when a manual calibration is performed. The drift of the loop current, or independent reference, can be monitored over the life of the device and an output can be provided when the drift exceeds a predetermined limit. Limit values can be stored in a memory of the device.

Although the present invention has been described with reference to preferred embodiments, workers skilled in the art will recognize that changes may be made in form and detail without departing from the spirit and scope of the invention. As used herein, an "independent" component in the loop current verification circuitry includes components which are not also used by loop current output circuitry. In some embodiments an independent component is one which is used exclusively in connection with the loop current verification circuitry and is not used by other circuitry within the process variable transmitter. In other configurations, all of the components used by the loop current verification circuitry used to measure or otherwise sense the current in the two wire process control loop are independent, except for a shared power supply, from the circuitry used to set the loop current in the two wire process control loop. In some configurations, the loop current verification circuitry compares the loop current to a threshold. The threshold can be fixed or adjustable. In some configurations, the threshold is remotely adjustable, for example, by transmitting commands over the two wire process control loop. In one configuration, the present invention provides a field device that contains a current regulated output, such as a 4–20 mA or Fieldbus protocol output including Foundation Fieldbus or Profibus. A field device has a current regulated output that contains a voltage or current reference whose accuracy and stability at least partially determine the accuracy and stability of the current regulated output. The field device contains a voltage or current reference that is independent of the reference used to generate the current regulated output.

What is claimed is:

1. A process device, comprising;
loop current output circuitry configured to apply an output current to a two wire process control loop; and
loop current verification circuitry coupled to the two wire process control loop to detect errors in the applied output current, wherein at least a portion of the loop current verification circuitry is independent from, and unaffected by, the loop current output circuitry.

2. The apparatus of claim 1 wherein the loop current verification circuitry includes a resistor coupled in series with the two wire process control loop.

3. The apparatus of claim 1 wherein the loop current verification circuitry includes a comparator configured to compare a signal level and provide an output related to electrical current in the two wire process control loop.

4. The apparatus of claim 1 wherein the loop current verification circuitry includes an analog to digital converter configured to measure a signal level related to current through the two wire process control loop.

5. The apparatus of claim 1 including:
plus and minus terminals and a common return;
a sense resistance conducting the loop current from the common return to the minus terminal;
an amplifier having a signal return coupled to the minus terminal and an amplified output.

6. The apparatus of claim 1 wherein the loop current verification circuitry compares a measured loop current value with an expected loop current value and provides an output related to the comparison.

7. The apparatus of claim 1 including a local output responsive to the loop current verification circuitry.

8. The apparatus of claim 1 wherein the loop current verification circuitry compares measured value to a threshold.

9. The apparatus of claim 1 wherein the loop current verification circuitry is configured to actuate calibration of the loop current output circuitry.

10. The apparatus of claim 1 including an output configured to place an output from the loop current verification circuitry on the two wire process control loop indicative of a detected error.

11. The apparatus of claim 1 including a visual indication output.

12. The apparatus of claim 1 including a digital indication output.

13. The apparatus of claim 1 including a wireless indication output.

14. The apparatus of claim 1 wherein the loop current output is compensated in response to the detected error.

15. The apparatus of claim 1 wherein the loop current verification circuitry is configured to measure a value of an independent reference.

16. A method in a process device for verifying loop current in a two wire process control loop, comprising:
sensing a process variable;
adjusting a loop current in the two wire process control loop as a function of the sense process variable;
verifying a value of the current in two wire process control loop using at least one electrical component which is independent of, and unaffected by, electrical components used to set the loop current in the two wire process control loop.

17. The method of claim 16 wherein verifying the value of the current includes sensing a voltage drop across a resistance coupled in series with the two wire process control loop.

18. The method of claim 16 wherein verifying a value of the current includes comparing a signal level and providing an output related to electrical current in the two wire process control loop.

19. The method of claim 16 including digitizing a signal level related to current through the two wire process control loop.

20. The method of claim 16 wherein verifying the loop current includes comparing a sensed loop current value with an expected loop current value and providing an output related to the comparison.

21. The method of claim 16 wherein the step of verifying is at least partially implemented in a microprocessor.

22. The method of claim 16 including:
sensing the loop current from a common return to a minus terminal; and
providing a signal return coupled to the minus terminal and an amplified output.

23. The apparatus of claim 1 wherein the output current is related to a measured process variable.

* * * * *